(12) United States Patent
Smith et al.

(10) Patent No.: US 7,070,833 B2
(45) Date of Patent: Jul. 4, 2006

(54) METHOD FOR CHEMICAL VAPOR DEPOSITION OF SILICON ON TO SUBSTRATES FOR USE IN CORROSIVE AND VACUUM ENVIRONMENTS

(75) Inventors: David A. Smith, Bellafonte, PA (US); Gary A. Barone, State College, PA (US); Martin E. Higgins, State College, PA (US); Bruce R. F. Kendall, State College, PA (US); David J. Lavrich, Julian, PA (US)

(73) Assignee: Restek Corporation, Bellefonte, PA (US)

( * ) Notice: Subject to any disclaimer, the term of this patent is extended or adjusted under 35 U.S.C. 154(b) by 0 days.

(21) Appl. No.: 10/642,866

(22) Filed: Aug. 18, 2003

(65) Prior Publication Data

US 2004/0175579 A1    Sep. 9, 2004

Related U.S. Application Data

(63) Continuation-in-part of application No. 10/382,040, filed on Mar. 5, 2003, now abandoned.

(51) Int. Cl.
*C23C 8/00* (2006.01)
*C23C 16/00* (2006.01)
*B05D 3/02* (2006.01)
*B05D 3/00* (2006.01)

(52) U.S. Cl. .................. 427/255.23; 427/255.395; 427/294; 427/295; 427/314; 427/376.2; 427/398.4; 427/585; 427/588

(58) Field of Classification Search ................ 428/446, 428/450, 451, 452, 454, 926, 938; 427/585, 427/588, 255.23, 255.395, 294, 314
See application file for complete search history.

(56) References Cited

U.S. PATENT DOCUMENTS

| | | | | | |
|---|---|---|---|---|---|
| 4,173,661 | A | * | 11/1979 | Bourdon | ....................... 438/485 |
| 4,579,752 | A | * | 4/1986 | Dubois et al. | .......... 427/255.18 |
| 4,671,997 | A | * | 6/1987 | Galasso et al. | .............. 426/446 |
| 4,714,632 | A | * | 12/1987 | Cabrera et al. | ......... 427/255.26 |
| 5,299,731 | A | * | 4/1994 | Liyanage et al. | ............ 228/219 |
| 5,480,677 | A | * | 1/1996 | Li et al. | ...................... 427/314 |
| 6,444,326 | B1 | * | 9/2002 | Smith | .......................... 428/446 |
| 6,511,760 | B1 | * | 1/2003 | Barone et al. | ............... 428/446 |

* cited by examiner

*Primary Examiner*—Stephen Stein
*Assistant Examiner*—Timothy M. Speer
(74) *Attorney, Agent, or Firm*—John F. A. Earley, III; Frank J. Bonini, Jr.; Harding, Earley, Follmer & Frailey

(57) ABSTRACT

A method of passivating the surface of a substrate to protect the surface against corrosion, the surface effects on a vacuum environment, or both. The substrate surface is placed in a treatment environment and is first dehydrated and then the environment is evacuated. A silicon hydride gas is introduced into the treatment environment, which may be heated prior to the introduction of the gas. The substrate and silicon hydride gas contained therein are heated, if the treatment environment was not already heated prior to the introduction of the gas and pressurized to decompose the gas. A layer of silicon is deposited on the substrate surface. The duration of the silicon depositing step is controlled to prevent the formation of silicon dust in the treatment environment. The substrate is then cooled and held at a cooled temperature to optimize surface conditions for subsequent depositions, and the treatment environment is purged with an inert gas to remove the silicon hydride gas. The substrate is cycled through the silicon depositing step until the surface of the substrate is covered with a layer of silicon. The treatment environment is then evacuated and the substrate cooled to room temperature.

23 Claims, No Drawings

METHOD FOR CHEMICAL VAPOR DEPOSITION OF SILICON ON TO SUBSTRATES FOR USE IN CORROSIVE AND VACUUM ENVIRONMENTS

CROSS-REFERENCE TO RELATED APPLICATION

This application is a continuation-in-part of, and claims priority from, U.S. application Ser. No. 10/382,040, filed on Mar. 5, 2003 now abandoned.

BACKGROUND OF THE INVENTION

1. Field of the Invention

The present invention relates to a method for vapor deposition of silicon on substrates to impart properties for use in corrosive and vacuum environments. More particularly, the present invention relates to an improved method of applying a silicon passivation layer to the surfaces of substrates.

2. Brief Description of the Related Art

The present invention overcomes many known deficiencies by using silicon as a passivation layer for a variety of substrates, including those comprised of metal (ferrous and non-ferrous), glass, carbon, copper, quartz, nickel-containing ferrous alloys, titanium, aluminum and ceramics. Substrates comprised of these materials generally have been known to have undesirable properties, which may, for example include one or more of the following: chemisorption of other molecules; reversible and irreversible physisorption of other molecules; catalytic activity with other molecules; allowing of attack from foreign species, resulting in a molecular, structural and/or cosmetic breakdown of the substrate surfaces and/or bulk; offgassing or outgassing of volatile materials (e.g. water vapor and organics), diffusion or permeation or other processes resulting in the release of gas molecules from a substrate into a vacuum environment resulting in extensive time required to reach a target vacuum and/or the inability to achieve a target vacuum and/or the inability to maintain a target vacuum; hydrogen permeation of a substrate where the is inner portion is subjected to vacuum.

Previous art has focused on layers of silicon modified by oxidation to prevent adsorption. Other previous art has looked at the use of silanes or silicon hydrides passed over metal surfaces at low temperatures to passivate the metal surface.

This invention has utility for substrates which may come in contact with species which degrade, are adsorbed or attack metal surfaces (such as organo-sulfurs, hydrogen sulfide, alcohols, acetates, metal hydrides, hydrochloric acid, nitric acid, sulfuric acid).

The prior art has utilized a single treatment of silicon hydride gases, either for silicon deposition or adsorption to metal surfaces, to impart passivation. This invention utilizes singular and multiple treatments with the silicon hydride gases to impart desired passivation by deposition of silicon.

Prior art also indicates preparation of metals surfaces by exposure to reducing gases prior to silicon deposition. This invention does not utilize such a pretreatment to achieve a passive surface.

U.S. Pat. No. 4,579,752 issued on Apr. 1, 1986 to Lawrence A. Dubois, et al. for an "Enhanced Corrosion Resistance of Metal Surfaces" discloses a method to increase the anti-corrosive characteristics of metal surfaces by creating a protective surface coating with silane gas in the presence of an oxidizing agent to produce a protective layer of SiO and excludes the use of iron in a substrate.

The present invention does not employ an oxidizing agent and therefore generates a layer of amorphous silicon. Additionally, the present invention has the ability to treat substrates with iron content in addition to those with non-metallic composition (e.g. carbon, silicon).

U.S. Pat. No. 4,671,997 issued on Jun. 9, 1987 to Francis S. Galasso, et al. for "Gas Turbine Composite Parts" utilizes multiple layers of silicon carbide (SiC) and silicon nitride (SiN) on gas turbine engine environments. The protective coatings are deposited at high temperature with organochlorosilanes as the reactive precursor.

U.S. Pat. No. 4,714,632 issued on Dec. 22, 1987 to Alejandro L. Cabrera discloses a "Method of Producing Silicon Diffusion Coatings on Metal Articles" where a silicon diffusion coating is formed on metal objects by first preheating in a reducing atmosphere.

U.S. Pat. No. 4,173,661 issued on Nov. 6, 1979 to Bernard Bourdon for a "Method for Depositing Thin Layers of Materials by Decomposing a Gas to Yield a Plasma" discloses a method for depositing thin layers of materials in the manufacture of silicon semi-conductor devices by applying a high-frequency, alternating voltage between a conductive earth surface and a conductive target surface located on opposite sides of a substrate to form a plasma in a chamber in the vicinity of the substrate.

U.S. Pat. No. 5,299,731 issued on Apr. 5, 1994 to A. Nimal Liyanage et al. for a "Corrosion Resistant Welding of Stainless Steel" discloses a process for welding stainless steel tubing in the presence of an inert gas having a silicon base gas in particular $SiH_4$. The stainless steel welding process of the '731 patent discloses utilization of a silicon containing gas, with argon for a purge.

U.S. Pat. No. 5,480,677 issued on Jan. 2, 1996 to Yao-En Li et al. for a "Process for Passivating Metal Surfaces to Enhance the Stability of Gaseous Hydride Mixtures at Low Concentration in Contact Therewith" discloses the use of temperatures of less than the passivating agent gaseous hydride decomposition temperature, and uses silane and other gaseous hydrides in their original form (molecular structure) to adsorb to a metal surface.

U.S. Pat. No. 6,511,760 issued on Jan. 28, 2003 to Gary A. Barone et al. discloses a method for passivating the interior surface of a gas storage vessel where silicon deposition is controlled to apply one or more layers of silicon to the interior surface of a vessel under pressure and heat.

SUMMARY OF THE INVENTION

The present invention provides a method of passivating any surface of a substrate to protect a surface against corrosion, the undesirable effects on a vacuum environment, or both. The invention provides a novel chemical deposition process through which a substrate is coated with silicon to impart properties for application in corrosive and/or vacuum environments. The use of single to multiple deposition layers with intermediate changes in process temperature, pressures and time has been found to impart coatings that provide enhanced properties to the substrate being treated that include, but are not limited to, application in corrosive environments for improved resistivity, and application in vacuum environments to reduce offgassing, outgassing, and hydrogen permeation of substrates. The substrate may have enhanced properties for vacuum environments, such as, for example, low ($10^5$ to $3.3\times10^3$ Pa), medium ($3.3\times10^3$ to $10^{-1}$ Pa), high ($10^{-1}$ to $10^{-4}$ Pa), very high ($10^{-4}$ to $10^{-7}$ Pa), ultrahigh ($10^{-7}$ to $10^{-10}$ Pa), and extreme ultrahigh (less than $10^{-10}$ Pa).

The substrate surface which may be coated can include an interior surface, as well as, or alternately, any other substrate surfaces. The present invention also provides substrates having contact surfaces which have been passivated in accordance with the method of the present invention to impart properties for improved resistance to corrosion and reduce the release of gas molecules subjected to a vacuum environment.

In the method of the present invention, a substrate is placed in an environment, such as, for example, a treatment chamber, which may be controlled to carry out the steps of the method. The method may be carried out using the substrate itself or with the substrate housed in a treatment chamber. In the method of the present invention, the surface of a substrate is initially preconditioned by dehydrating the substrate surface. In the dehydration step, the substrate is heated to a temperature in a preferred range of from about 20° C. to 600° C. for a preferred duration of from about 10 to 240 minutes. The substrate is preferably heated in an inert gas or in a vacuum.

After the surfaces of the substrate have been dehydrated, the environment surrounding the substrate surface or treatment chamber is evacuated. A silicon hydride gas is introduced into the environment surrounding the substrate surface or treatment chamber. The substrate and gas contained therein are heated and pressurized to decompose the silicon hydride gas in the treatment chamber. The heating of the silicon hydride gas may be done prior to, during or after the introduction of the gas into the treatment chamber. Preferably, the treatment chamber may be heated and then followed by the introduction of the silicon hydride gas. As the gas decomposes, a layer of silicon is deposited on the surface of the substrate.

The duration of the silicon deposition step and the pressure of the gas is controlled to prevent the formation of silicon dust in the substrate or treatment chamber. At the end of the silicon deposition step, the substrate environment or treatment chamber is cooled and held at a temperature for a period of time, and is purged with an inert gas to remove the silicon hydride gas. The purging may take place prior to, after or while the substrate is cooling. Preferably, the purging is done as the substrate is being cooled. If the silicon layer completely covers the surface of the substrate, the substrate is then evacuated and cooled to room temperature. If the silicon layer does not completely cover the substrate surface, the silicon deposition step is repeated until the substrate surface is completely covered and thereby passivated.

In the method of the present invention, the silicon hydride gas is preferably selected from the group comprising $SiH_4$ and $Si_nH_{n+2}$. The silicon hydride gas is heated to a temperature approximately equal to the gas's decomposition temperature, preferably to a temperature in the range of from about 300° C. to 600° C. Preferably, the silicon hydride gas is pressurized to a pressure in a preferred range of from about $1\times10^{-7}$ torr to 2500 torr, and in a particularly preferred range of from about 100 torr to 250 torr.

The present invention also provides a corrosion resistant substrate or component having a passivated surface. For example, the substrate may comprise metal (ferrous and non-ferrous), glass, carbon, copper, quartz, nickel-containing ferrous alloys, titanium, aluminum and ceramics. The surface of the substrate has an average surface roughness RA. A silicon layer is formed over the substrate surface to passivate the surface. The silicon layer is formed from a plurality of layers of silicon and is substantially free of silicon dust. Preferably from one to ten layers of silicon may be applied.

DETAILED DESCRIPTION OF THE PREFERRED EMBODIMENTS

The method of the present invention is described below with reference to a substrate. However, it should be appreciated to those of ordinary skill in the art that the method of the present invention may by used to passivate the surface of a component or substrate, and in particular substrates which have undesirable traits when exposed to vacuum conditions or corrosive substances that would benefit from passivation. The method of the present invention may by used to passivate the surfaces of substrates which are comprised of metal (ferrous and non-ferrous), glass, carbon, copper, quartz, nickel-containing ferrous alloys, titanium, aluminum and ceramics. The passivation of a substrate surface which is contacts a corrosive substance or molecules, such as, for example, organo-sulfurs, hydrogen sulfide, alcohols, acetates, metal hydrides, hydrochloric acid, nitric acid, or sulfuric acid and aqueous salts, serves to protect the surface against corrosion. The passivation of a substrate surface also provides benefits to the substrate in vacuum environments to reduce undesirable effects, including offgassing and outgassing, and hydrogen permeation of substrates.

In the method of the present invention, the surface to be passivated is initially preconditioned. Successive layers of silicon are then applied to the surface under controlled conditions where the surface is cooled and maintained at a temperature for a period of time between successive deposition layers. Preferably, silicon deposition layers are applied until the silicon layer covers the entire surface area of the substrate. The method may be carried out on or within the substrate itself, or by placing the substrate in a controlled environment, such as, for example, a treatment chamber.

The surface of the substrate is initially preconditioned by removing any water adsorbed on the substrate metal surface. In the dehydration step, the vessel is heated to a temperature in the preferred range of from about 20° C. to 600° C. for a time period of a preferred duration from about 10 minutes to 240 minutes (4 hours). During the dehydration step, the treatment chamber containing the substrate to be passivated is either evacuated or filled with an inert gas (noble gases or nitrogen). At the end of the dehydration process, the treatment chamber is evacuated to remove the vaporized water.

After the treatment chamber is dehydrated and evacuated, silicon hydride gas, such as $SiH_4$ or $Si_nH_{n+2}$, is introduced onto the substrate surface or into the treatment chamber containing the substrate. Preferably, the pressure of the silicon hydride gas is at a preferred range between about $1\times10^{-7}$ torr to 2500 torr, and a particularly preferred range of from about 100 torr to 250 torr. The substrate or component, and gas contained in the treatment chamber, is heated to a temperature approximately equal to the gas decomposition temperature if it is not already at that temperature as a result of the dehydration step, Preferably, the substrate and gas are heated to a temperature in the preferred range of from about 300° C. to 600° C. The silicon hydride gas may be introduced under heat, or introduced at room temperature and subsequently heated. At these pressures and temperatures, the silicon hydride gas decomposes into silicon and hydrogen gas at or near the substrate surface. The silicon formed during the decomposition process attaches to the surface of the substrate or component being treated.

The duration of the silicon deposition process is controlled in accordance with the method of the present invention. Under the above-described conditions, the decomposition of silicon hydride gas in the treatment chamber may eventually also form an undesirable by-product referred to herein as silicon dust as a result of pressure, time and temperature. Silicon dust is the result of the silicon hydride gas reacting with itself to form silicon and hydrogen gas. This gas phase nucleation forms silicon dust which will settle to the surface of the substrate or treatment chamber by gravity and may compromise the integrity of the silicon layer being formed on the substrate surface. The silicon dust may also create a physical barrier between successive layers of silicon in the passive layer.

The formation of silicon dust may be affected by the duration of the deposition process, the pressure of the gas, and the presence of contaminants on the surface of the substrate, or a combination of any or all of them. In order to facilitate the prevention of the formation of silicon dust, the duration of the silicon deposition process must be controlled and limited to a period in a preferred range of from about 1 minute up to about 480 minutes (8 hours). The silicon deposition process may be abbreviated as one way to prevent the formation of silicon dust. However, the layer of silicon may not completely cover the entire substrate surface after one silicon deposition cycle. Therefore, the silicon deposition cycle may be repeated several times to build up the passive layer of silicon to the requisite thickness. However, the performance of the substrate may benefit from a single deposition layer. Preferably, performance of the substrate may be optimized by the deposition of one to ten layers of silicon on the substrate surface, independent of the surface roughness. It may be particularly preferred to optimize performance by having six silicon layers deposited on the substrate surface.

After the first silicon deposition cycle, the treatment chamber containing the substrate is purged with an inert gas to remove the silicon hydride gas. If the layer of silicon does not completely cover the surface of the substrate, the silicon deposition cycle may be repeated. Prior to deposition of a subsequent silicon layer, the substrate surface is cooled and permitted to remain at a lower temperature to optimize the surface properties in preparation for subsequent silicon layer deposition. Preferably, the substrate surface is cooled to a range of about 50° C. to 400° C., and permitted to remain at the cooled temperature for about 5 to 100 minutes.

That is, a rough or smooth (electropolished or polished) surface with an RA less than about 20 microinches may derive the benefits of the method with a single deposition cycle. The number of layers for vacuum atmosphere performance of a substrate may be optimized independent of surface roughness. The number of layers for improved resistance to corrosion may be optimized independent of surface roughness.

After the passive layer of silicon is formed, the treatment chamber containing the substrate is cooled to a preferred range of about 50–400° C., held for a preferred time duration of from about 5 to 100 minutes, and is purged with an inert gas to remove the reactive silicon hydride gas. This inert gas purge ensures that the decomposition reaction of the silicon hydride is stopped to reduce unwanted gas phase nucleation problems which occur due to reaction of the silicon hydride components with themselves as opposed to the surface of the substrate or the treatment chamber. After the final purging step, the treatment chamber containing the substrate is evacuated and cooled to room temperature.

The passive silicon layer deposited on the substrate surface may be about 100 to 50,000 angstroms thick.

The method has use in passivating substrates which may be exposed to a corrosive substance or used in a vacuum environment, or both, to impart beneficial properties to the substrate. The method of the present invention has particular use for passivating substrates which may be used in environments which contain or may subject the substrate to a corrosive element or substance. The method of the present invention may be used to impart resistive properties to a substrate to minimize undesirable effects of a corrosive substance such as for example chemisorption of other molecules; reversible and irreversible physisorption of other molecules, and catalytic activity with other molecules; allowing of attack from foreign species, resulting in a molecular, structural and/or cosmetic breakdown of the substrate surfaces and/or bulk; or any of the aforementioned combinations. In addition, the method of the present invention has particular use for passivating substrates which may be used in vacuum environments. The method of the present invention may be used to impart chemically resistive properties to a substrate to minimize undesirable surface effects in a vacuum environment on a substrate such as for example offgassing or outgassing of volatile materials (e.g. water vapor and organics) from a substrate under vacuum environments resulting in extensive time required to reach a target vacuum and/or the inability to achieve a target vacuum and/or the inability to maintain a target vacuum; hydrogen permeation of a substrate under vacuum environments through coating on the inside and/or outside whereas the inner portion is subjected to vacuum; or any of the aforementioned combinations.

Within performance in a vacuum atmosphere, the deposition on the substrate may improve the substrate performance with respect to deleterious effects of hydrogen permeation.

The invention is useful for imparting improved properties on the surface of a substrate. Substrates to which the method may be applied may have one or more surfaces. The invention may be used to coat one or more surfaces of a substrate. For example, a substrate may have an interior surface and an exterior or outside surface. The method may also impart improved resistance to, or prevention of, hydrogen permeation by application of a coating on the inside of a substrate which is subjected to a vacuum. The method may also impart improved resistance to, or prevention of, hydrogen permeation by application of a coating on the outside of a substrate where the inside of the substrate is subjected to a vacuum. Alternately, the coating may be provided on an inner surface and an outer surface of a substrate.

Although the method may be carried out using a treatment chamber to house the substrate during the process steps, it will be understood that the substrate itself, depending on its configuration, may serve as its own treatment chamber where the method may be carried out within the substrate.

The invention claimed is:

1. A method of passivating a surface of a substrate to protect the surface against corrosion or the undesirable effects on a vacuum atmosphere, comprising the steps of:
   a) placing the substrate in an environment for treatment;
   b) dehydrating a surface of the substrate;
   c) evacuating the environment;
   d) introducing a silicon hydride gas into the treatment environment to contact the substrate;
   e) heating the silicon hydride gas prior to, during or after the introduction of silicon hydride gas into the treatment environment;

f) pressurizing the silicon hydride gas in the treatment environment;
g) depositing a layer of silicon on a surface of the substrate;
h) controlling one or more of the duration of the silicon depositing step, the pressure of the silicon hydride gas, and the presence of contaminants on the substrate surface to prevent the formation of silicon dust;
i) cooling the substrate to a lower temperature and maintaining the substrate at a lower temperature for a period of time;
j) purging the treatment environment with an inert gas to remove the silicon hydride gas;
k) cycling the substrate through steps c) through j) for at least one cycle;
l) evacuating the treatment environment; and,
m) cooling the substrate to room temperature.

2. The method of claim 1, wherein the lower temperature to which the substrate is cooled in step i) is from about 50° C. to 400° C.

3. The method of claim 1, wherein the period of time at which the substrate is maintained at a lower temperature is from about 5 to 100 minutes.

4. The method of claim 2, wherein the period of time at which the substrate is maintained at a lower temperature is from about 5 to 100 minutes.

5. The method of claim 1, wherein the range of temperatures to which the substrate is cooled and the duration of time period for which the substrate is maintained at a lower temperature are optimized to optimize the surface properties.

6. The method recited in claim 1, said dehydration step comprising heating the substrate to a temperature in the range of from about 20° C. to 600° C. for a duration of from about 10 to 240 minutes.

7. The method recited in claim 6, including the step of heating the substrate in an inert gas along with purging of the gas or applying a vacuum, or both.

8. The method recited in claim 1, said silicon hydride gas being selected from the group comprising $SiH_4$ and $Si_nH_{n+2}$.

9. The method recited in claim 1, said silicon hydride gas being heated to a temperature approximately equal to the gas's decomposition temperature.

10. The method recited in claim 9, said silicon hydride gas being heated to a temperature in the range of from about 300° C. to 600° C.

11. The method recited in claim 1, said silicon hydride gas being pressurized to a pressure in the range of from about 0.1 torr to 2500 torr.

12. The method recited in claim 1, said layer of silicon being deposited on the substrate for a period in the range of from about 1 to 480 minutes.

13. The method recited in claim 1, wherein the substrate is cycled through steps a) through j) to optimize the substrate performance in a vacuum atmosphere.

14. The method recited in claim 1, wherein the substrate is cycled through steps a) through j) to optimize the substrate performance against the undesirable effects of a corrosive substance.

15. The method recited in claim 1, wherein the substrate is cycled through steps a) through j) to result in from 1 to 10 layers of silicon being deposited on said substrate surface.

16. The method recited in claim 14, wherein the substrate is cycled through steps a) through j) to result in from 1 to 10 layers of silicon being deposited on said substrate surface.

17. The method recited in claim 13, wherein the substrate is cycled through steps a) through j) to result in 6 layers of silicon being deposited on said substrate surface.

18. The method recited in claim 14, wherein the substrate is cycled through steps a) through j) to result in 6 layers of silicon being deposited on said substrate surface.

19. A method of passivating a surface of a substrate to protect the surface against corrosion or the undesirable effects on a vacuum atmosphere, comprising the steps of:
a) placing the substrate in an environment for treatment;
b) dehydrating the surface of the substrate;
c) evacuating the environment;
d) introducing a silicon hydride gas into the treatment environment to contact the substrate;
e) heating the silicon hydride gas in the treatment environment;
f) pressurizing the silicon hydride gas in the treatment environment;
g) depositing a layer of silicon on a surface of the substrate;
h) controlling one or more of the duration of the silicon depositing step, the pressure of the silicon hydride gas, and the presence of contaminants on the substrate surface to prevent the formation of silicon dust;
i) cooling the substrate to a lower temperature and maintaining the substrate at a lower temperature for a period of time;
j) purging the treatment environment with an inert gas to remove the silicon hydride gas;
k) cycling the substrate through steps c) through j) for at least one cycle;
l) evacuating the treatment environment; and,
m) cooling the substrate to room temperature;
wherein said lower temperature to which the substrate is cooled in step i) is from about 50° C. to 400° C.;
said period of time at which the substrate is maintained at a lower temperature is from about 5 to 100 minutes;
said dehydration step comprises heating the substrate to a temperature in the range of from about 300° C. to 600° C. for a duration of from about 10 to 240 minutes;
including the step of heating the substrate in an inert gas or in a vacuum;
said silicon hydride gas being selected from the group consisting of $SiH_4$ and $Si_nH_{n+2}$;
said silicon hydride gas being heated to a temperature approximately equal to the gas's decomposition temperature;
said silicon hydride gas being heated to a temperature in the range of from about 300° C. to 600° C.;
said silicon hydride gas being pressurized to a pressure in the range of from about 0.1 torr to 2500 torr; and
said layer of silicon being deposited on the substrate surface for a period in the range of from about 1 to 480 minutes.

20. The method recited in claim 1, said silicon hydride gas being pressurized to a pressure in the range of from about $1 \times 10^{-7}$ to 2500 torr.

21. The method recited in claim 1, said silicon hydride gas being pressurized to a pressure in the range of from about 100 to 250 torr.

22. A method of passivating a surface of a substrate to protect the surface against corrosion or the undesirable effects on a vacuum atmosphere, comprising the steps of:
a) placing the substrate in an environment for treatment;
b) dehydrating the surface of the substrate;
c) evacuating the environment;
d) introducing a silicon hydride gas into the treatment environment to contact the substrate;
e) heating the silicon hydride gas in the treatment environment;

f) pressurizing the silicon hydride gas in the treatment environment;
g) depositing a layer of silicon on a surface of the substrate;
h) controlling one or more of the duration of the silicon depositing step, the pressure of the silicon hydride gas, and the presence of contaminants on the substrate surface to prevent the formation of silicon dust;
i) cooling the substrate to a lower temperature and maintaining the substrate at a lower temperature for a period of time;
j) purging the treatment environment with an inert gas to remove the silicon hydride gas;
k) cycling the substrate through steps c) through j) for at least one cycle;
l) evacuating the treatment environment; and,
m) cooling the substrate to room temperature;
wherein said lower temperature to which the substrate is cooled in step i) is from about 50° C. to 400° C.;
said period of time at which the substrate is maintained at a lower temperature is from about 5 to 100 minutes;
said dehydration step comprises heating the substrate to a temperature in the range of from about 300° C. to 600° C. for a duration of from about 10 to 240 minutes;
including the step of heating the substrate in an inert gas or in a vacuum;
said silicon hydride gas being selected from the group consisting of $SiH_4$ and $Si_nH_{n+2}$;
said silicon hydride gas being heated to a temperature approximately equal to the gas's decomposition temperature;
said silicon hydride gas being heated to a temperature in the range of from about 300° C. to 600° C.;
said silicon hydride gas being pressurized to a pressure in the range of from about $1 \times 10^{-7}$ torr to 2500; and
said layer of silicon being deposited on the substrate surface for a period in the range of from about 1 to 480 minutes.

23. A method of passivating a surface of a substrate to protect the surface against corrosion or the undesirable effects on a vacuum atmosphere, comprising the steps of:
a) placing the substrate in an environment for treatment;
b) dehydrating the surface of the substrate;
c) evacuating the environment;
d) introducing a silicon hydride gas into the treatment environment to contact the substrate;
e) heating the silicon hydride gas in the treatment environment;
f) pressurizing the silicon hydride gas in the treatment environment;
g) depositing a layer of silicon on a surface of the substrate;
h) controlling one or more of the duration of the silicon depositing step, the pressure of the silicon hydride gas, and the presence of contaminants on the substrate surface to prevent the formation of silicon dust;
i) cooling the substrate to a lower temperature and maintaining the substrate at a lower temperature for a period of time;
j) purging the treatment environment with an inert gas to remove the silicon hydride gas;
k) cycling the substrate through steps c) through j) for at least one cycle;
l) evacuating the treatment environment; and,
m) cooling the substrate to room temperature;
wherein said lower temperature to which the substrate is cooled in step i) is from about 50° C. to 400° C.;
said period of time at which the substrate is maintained at a lower temperature is from about 5 to 100 minutes;
said dehydration step comprises heating the substrate to a temperature in the range of from about 300° C. to 600° C. for a duration of from about 10 to 240 minutes;
including the step of heating the substrate in an inert gas or in a vacuum;
said silicon hydride gas being selected from the group consisting of $SiH_4$ and $Si_nH_{n+n}$;
said silicon hydride gas being heated to a temperature approximately equal to the gas's decomposition temperature;
said silicon hydride gas being heated to a temperature in the range of from about 300° C. to 600° C.;
said silicon hydride gas being pressurized to a pressure in the range of from about 100 torr to 250 torr; and
said layer of silicon being deposited on the substrate surface for a period in the range of from about 1 to 480 minutes.

* * * * *